United States Patent [19]

Barnes et al.

[11] Patent Number: 5,178,739

[45] Date of Patent: Jan. 12, 1993

[54] APPARATUS FOR DEPOSITING MATERIAL INTO HIGH ASPECT RATIO HOLES

[75] Inventors: Michael S. Barnes, Mahopac; John C. Forster, Poughkeepsie; John H. Keller, Newburgh, all of N.Y.

[73] Assignee: International Business Machines Corporation, Armonk, N.Y.

[21] Appl. No.: 765,651

[22] Filed: Sep. 25, 1991

Related U.S. Application Data

[63] Continuation of Ser. No. 607,431, Oct. 31, 1990, abandoned.

[51] Int. Cl.⁵ ............................................. C23C 14/34
[52] U.S. Cl. .......................... 204/192.12; 204/298.06; 204/298.08; 204/298.21
[58] Field of Search ............... 204/192.12, 298.06, 204/298.08, 298.16, 298.17, 298.18, 298.12, 298.19, 298.21; 427/250, 255.1

[56] References Cited

U.S. PATENT DOCUMENTS

| | | | |
|---|---|---|---|
| 4,727,293 | 2/1988 | Asmussen | 315/111.41 |
| 4,911,814 | 3/1990 | Matsuoka et al. | 204/192.12 X |
| 4,925,542 | 5/1990 | Kidd | 204/192.31 |
| 4,941,915 | 7/1990 | Matsuoka et al. | 204/298.12 |
| 4,990,229 | 2/1991 | Campbell et al. | 204/298.18 X |
| 5,022,977 | 6/1991 | Matsuoka et al. | 204/298.16 |

FOREIGN PATENT DOCUMENTS

0413291A2  8/1990  European Pat. Off.

OTHER PUBLICATIONS

Yamashita, "Fundamental . . . apparatus", J. Vac. Sci., Technol., A7(2), Mar./Apr. 1989, pp. 151–158.

Primary Examiner—Nam Nguyen
Attorney, Agent, or Firm—Richard A. Romanchik

[57] ABSTRACT

A sputter deposition system includes a hollow, cylindrical sputter target 14 disposed between an end sputter target 12 and a substrate 19, all of which are contained in a vacuum chamber 20. A plurality of magnets 24 are disposed outside the chamber 24 to create intense, plasma regions 48 near the interior surface of the cylindrical target 14 and thereby causing ionization of sputtered neutrals. Rf power is inductively coupled into the chamber 24 through rf coil 16 to sustain the plasma and substrate 19 is electrically biased to control ion directionality and energy.

24 Claims, 7 Drawing Sheets

APPARATUS FOR DEPOSITING MATERIAL INTO HIGH ASPECT RATIO HOLES

This is a continuation application of copending application Ser. No. 607,431 filed Oct. 31, 1990, abandoned.

TECHNICAL FIELD

This invention relates to the deposition of materials onto a semiconductor substrate and more particularly, a high plasma density, low pressure, low temperature, sputtering tool for depositing materials uniformly into high aspect ratio holes or trenches.

BACKGROUND ART

The ability to deposit materials into high aspect ratio (AR) holes (holes with a depth to width ratio greater than one) on a semiconductor substrate is becoming increasingly more important in the semiconductor industry for back-end-of-line applications such as the filling of inter-level vias.

Prior techniques used to deposit materials into high AR holes include: chemical vapor deposition (CVD); electron cyclotron resonance chemical vapor deposition (ECR CVD); plasma enhanced chemical vapor deposition (PECVD) and rf sputtering.

CVD is undesirable for two reasons: (a) it is a relatively slow process; and (b) high temperature substrate curing is required following the deposition. High temperature curing is unfavorable for large scale integrated (LSI) components.

ECR CVD and PECVD have been introduced to lower the required curing temperatures. These techniques, however, are also undesirable because the films produced often contain hydrogen, thereby making them dimensionally unstable at elevated temperatures. Also, these techniques, like all CVD processes, are slow processes that restrain throughput.

Traditional rf sputtering does not fill high AR holes uniformly because there is no directionality to the deposition. The sputtered atoms in the plasma generated are primarily neutral (plasma referred to as having a low ionization ratio). The resultant random neutral atom impingment on the substrate causes sputtered material to build up along the walls of the holes faster than the bottom thereby producing a void in the filled hole (a condition referred to as angel wings) which makes contact to the filled hole unreliable. Also, the background gas (e.g. Argon) necessary to support the process: a) causes back scattering of the sputtered material which consequently reduces the transmission of this material to the substrate; and b) gets incorporated into the films. A further disadvantage to traditional rf sputtering is that it is difficult to obtain a plasma density high enough to sputter at energy efficient voltages for single substrate deposition.

The following three articles disclose some recent improvements to traditional rf sputtering: 1) Ono, Takahashi, Oda, and Matsuo, "Reactive Ion Stream Etching and Metallic Compound Deposition Using ECR Plasma Technology", Symposium on VLSI Technology. Digest of Technical Papers 1985 pp 84–85, Bus. Center Acad. Soc Japan (ONO); 2) Yamashita, "Fundamental characteristics of built-in high-frequency coil-type sputtering apparatus", J.Vac.Sci.Technol. A7(2), Mar/Apr 1989 pp 151-158 (YAMASHITA); and 3) Matsuoka and Ono, "Dense plasma production and film deposition by new high-rate sputtering using an electric mirror", J.Vac.Sci.Technol. A7(4), Jul/Aug 1989 pp 2652-2656 (MATSUOKA).

ONO discloses an ECR plasma generator adapted for depositing metals on a substrate by placing a cylindrical sputtering target around the plasma stream at the plasma extraction window. Sputtered particles are activated for film formation reaction in the high plasma density region of magnetron mode discharge and in the plasma stream. Film formation reaction is also enhanced by the moderate energy ion bombardment irradiated by the plasma stream. This system provides higher deposition rates than prior sputtering techniques, but it doesn't provide directionality to the deposition (due to a low ionization ratio) and therefore fails to provide a solution to the aforementioned angel wing problem.

YAMASHITA discloses a sputtering system with a high-frequency discharge coil placed between the target and the substrate holder. This configuration can produce a plasma with a variable ionization ratio of the sputtered atoms. High ionization ratio deposition is not practical with this apparatus, however, because secondary electrons generated by the ions impinge on the substrate and thereby cause excessive substrate heating. Furthermore, high deposition rates can only be achieved with this device when the deposition is dominated by neutral atoms. Depositions dominated by neutral atoms have no directionality and therefore cause angel winging in high AR holes.

MATSUOKO discloses a sputtering system using an electric mirror consisting of a planar target, a cylindrical target, a magnetic coil, and a substrate plate. High plasma densities (of primarily neutral atoms) in close proximity to the cylindrical target are obtained by this configuration, but like the ONO configuration, there is no directionality to the deposition and angel winging occurs.

An efficient, reliable system to deposit materials into high AR holes on semiconductor substrates which avoids the problems of the previously mentioned systems is highly desirable.

DISCLOSURE OF THE INVENTION

An object of the present invention is to provide an improved sputtering system for high rate material deposition.

Another object is to provide for a deposition system which can uniformly fill high aspect ratio holes and trenches of semiconductor substrates.

Yet another object is to provide for a deposition system which functions at low pressures, low temperature and energy efficient voltages.

According to the present invention, a rf sputtering apparatus includes a circular end sputter target and a biased substrate at opposite ends of a vacuum chamber. A cylindrical sputter target is positioned between the end target and substrate. Rf or DC bias is applied to the targets in order to produce sputtering. Permanent magnets are placed in close proximity to the sputter targets to cause magnetron discharges. A rf coil is disposed inside the chamber to inductively couple rf power into the chamber to maintain a high density plasma in order to ionize sputter neutrals and cause the plasma to be more evenly distributed throughout the chamber. The rf coil may be magnetized to prevent recombination of the plasma with the surface of the coil.

The present invention produces good quality films at fast rates, low pressure and low temperature. It is compact and easily manufacturable and can be used to produce sputter ion deposition. Also, the uniformity of deposition can be adjusted for different requirements, including filling high AR holes.

These and other objects, features, and advantages of the present invention will become more apparent in the light of the detailed description of exemplary embodiments thereof, as illustrated by the drawings.

BEST MODE FOR CARRYING OUT THE INVENTION

Figure 1:
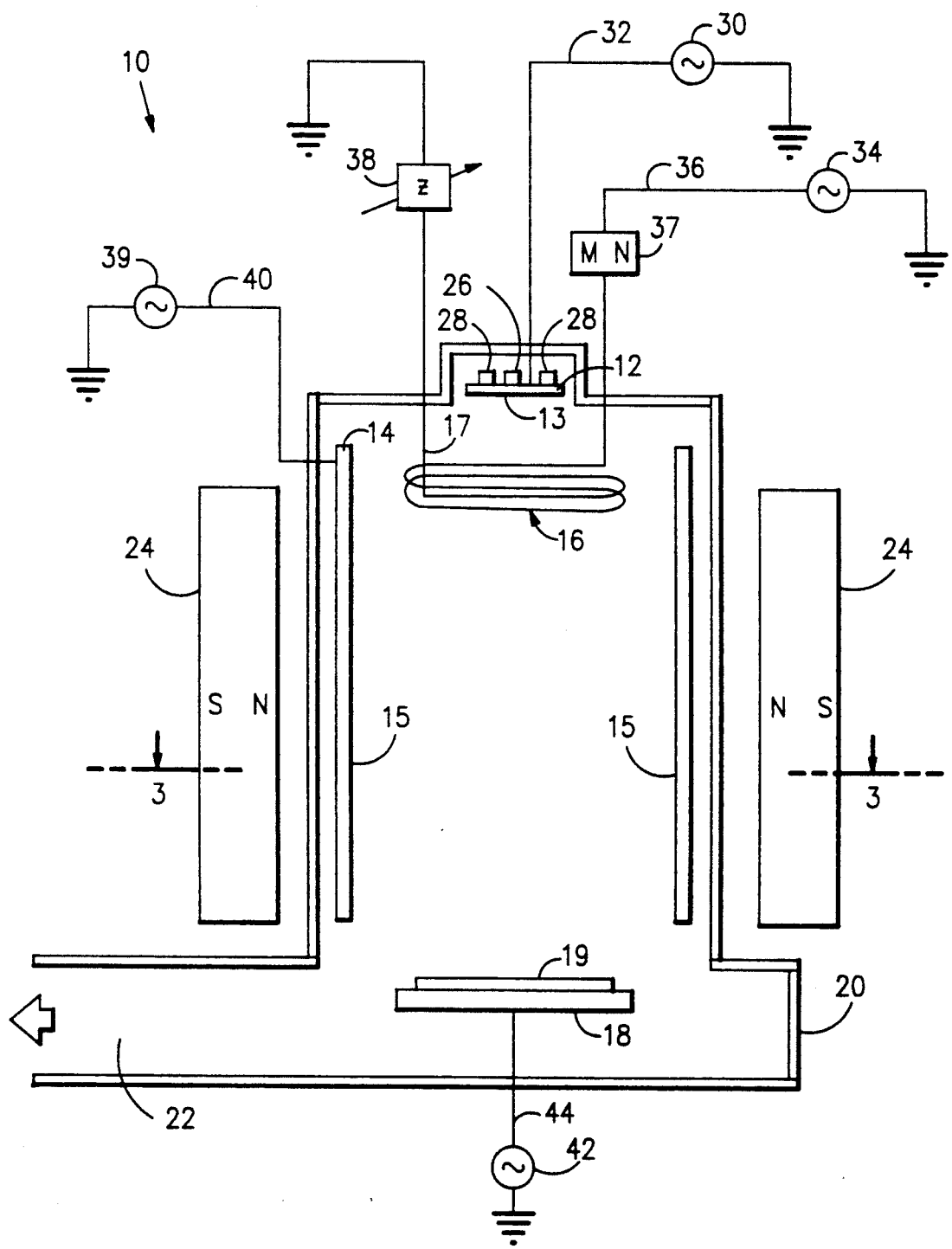
FIG. 1 is a cross sectional, schematic drawing of a first embodiment of a sputter system according to the present invention.

Referring now to FIG. 1, a sputter system 10 includes a vacuum chamber 20, which contains a circular end sputter target 12, a hollow, cylindrical, thin, cathode magnetron target 14, a rf coil 16 and a chuck 18, which holds a semiconductor substrate 19. The atmosphere inside the vacuum chamber 20 is controlled through channel 22 by a pump (not shown). The vacuum chamber 20 is cylindrical and has a series of permanent, magnets 24 positioned around the chamber and in close proximity therewith to create a multipole field configuration near the interior surface 15 of target 12. Magnets 26, 28 are placed above end sputter target 12 to also create a multipole field in proximity to target 12. A singular magnet 26 is placed above the center of target 12 with a plurality of other magnets 28 disposed in a circular formation around magnet 26. For convenience, only two magnets 24 and 28 are shown. The configuration of target 12 with magnets 26, 28 comprises a magnetron sputter source 29 known in the prior art, such as the Torus-10E system manufactured by K. Lesker, Inc.. A sputter power supply 30 (DC or rf) is connected by a line 32 to the sputter target 12. A rf supply 34 provides power to rf coil 16 by a line 36 and through a matching network 37. Variable impedance 38 is connected in series with the cold end 17 of coil 16. A second sputter power supply 39 is connected by a line 40 to cylindrical sputter target 14. A bias power supply 42 (DC or rf) is connected by a line 44 to chuck 18 in order to provide electrical bias to substrate 19 placed thereon, in a manner well known in the prior art.

Power supplies 30, 39 cause atoms to be sputtered off of targets 12, 14, as is well known in the prior art. Sputter targets 12, 14 must therefore be made of the material to be deposited on the substrate, such as copper. Rf coil 16 must also either be made of, or coated with the deposition material in order to prevent contamination of the deposited film.

The magnets 24 create static B fields which extend into the vacuum chamber 20 and form "cusps" (46 in FIG. 3) near the interior surface 15 of cylindrical target 14. The close proximity of cylindrical sputter target 14 to the multipole magnets 24 leads to regions of intense magnetron discharges between these cusps. An illustration of the magnetic cusps and their effect upon the cylindrical target sputtering is provided in more detail in FIG. 3. Magnets 26, 28 placed above target 12 create magnetron discharges at that target in a similar manner.

Material is sputtered off targets 12,14 when these targets are provided either DC bias or rf power from respective power supplies 30, 39. The regions (48 in FIG. 3) near the interior surface of cylindrical target 14 adjacent to the magnets will sputter quickly, since plasma ions preferentially escape through the aforementioned magnetic cusps, leading to high plasma density and high sputter rates in the cusps. Cylindrical target 14 will also sputter quickly in the regions between the magnets because the magnetic field (which is parallel to the wall between the magnets) will give rise to a magnetron discharge. The high plasma densities associated with magnetron discharges will produce a high sputter rate from cylindrical target 14 between the magnetic cusp regions (46 in FIG. 3) and a large fraction of neutral sputtered atoms will be ionized in the high density rf plasma.

Power provided by rf power supply 34 is transmitted on line 36 through matching network 37 to rf coil 16, and thereby inductively coupled into the aforementioned plasma in order to sustain the plasma and cause a more even plasma distribution throughout the vacuum chamber 20. A variable impedance 38 may be placed in series with the rf coil 16 to control the rf voltage on the coil.

The plasma created by the present invention will have a high ionization fraction of sputtered atoms due to: a) ionization by primary electrons; b) ion charge exchange with the sputtering gas ions (e.g. Argon ions); and c) Penning ionization of the sputtered atoms by the sputtering gas. Penning ionization is particularly sensitive to the chamber pressure (part of which is attributable to sputter gas pressure), with optimum pressure ranging from 10 mTorr to 50 mTorr. If the pressure is too high, the sputtered atoms diffuse back into the target, thereby lowering the effective deposition rate. Also, the plasma density will be lowered which will reduce the amount of power coupled to the plasma. If the pressure is too low, Penning ionization will stop altogether.

The DC or rf bias provided by voltage source 42 to the substrate 19 will determine the directionality of the deposition because the bias affects a) the trajectories of the ionized sputtered atoms; and b) the amount of resputtering. Consequently, the trajectories of the ions can be adjusted such that high AR holes in the substrate may be uniformly filled without angel winging effects. In addition, heavier gases (gases with an atomic mass greater than the atomic mass of the sputtered material), such as Xenon, may be added to the vacuum chamber to further affect the deposition profile by reducing angel winging effects. Also, the uniformity of deposition can be adjusted by changing the voltage or power split between the targets 12, 14 because cylindrical target 14 produces the highest deposition rate on the outside part of substrate 19 and the target 12 produces the highest deposition rate on the inside part of substrate 19.

Another advantage to the present invention is that the magnetic fields created by magnets 26, 28 confine free electrons produced by the end sputter target 12, thereby lowering secondary electron heat loading of the substrate 19.

Figure 2:
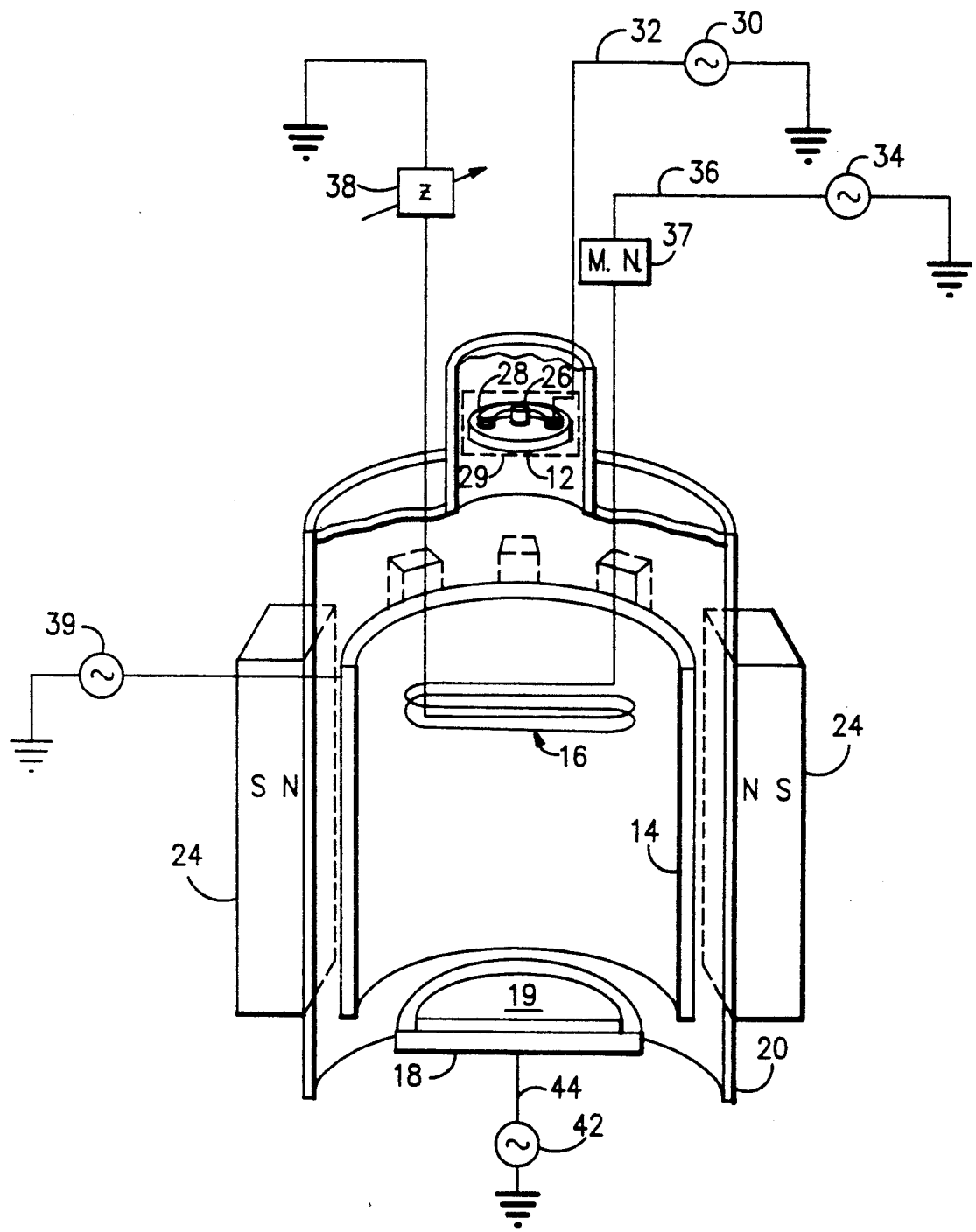
FIG. 2 is a perspective, cross sectional, schematic drawing of a first embodiment of a sputter system according to the present invention.

Referring now to FIG. 2, sputter targets 12,14 are provided power by respective sources 30,38, (which may be DC or rf) to cause material to be sputtered into vacuum chamber 20. Magnets 24 cause regions 48 of intense plasma in close proximity to the interior surface 15 of target 14. Rf power provided by source 34 is inductively coupled into the plasma through coil 16. Bias applied by voltage source 42 through line 44 to chuck 18 will attract ionized atoms onto substrate 19 and facilitate directional deposition.

Figure 3:
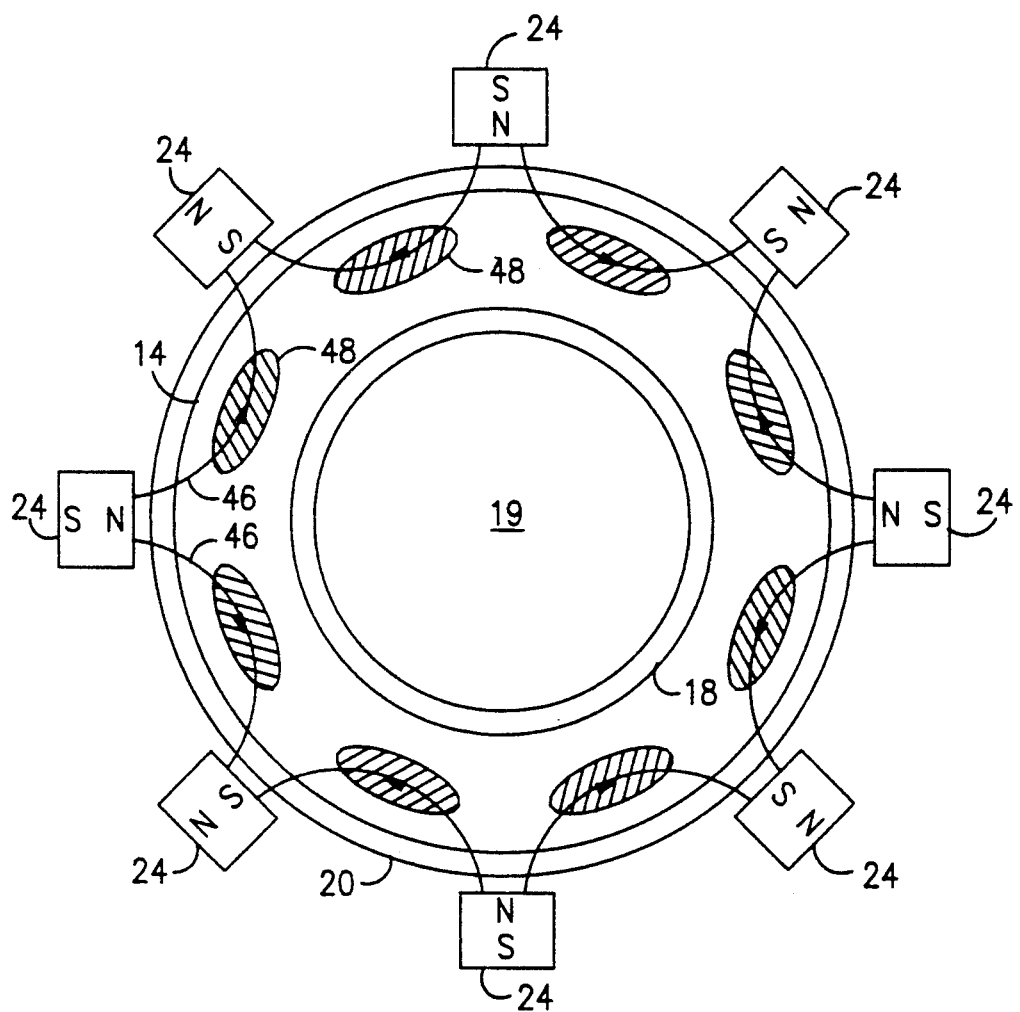
FIG. 3 is a cross sectional view taken along line 3—3 of FIG. 1.

Referring now to FIG. 3, magnets 24 create a static multipole B field, represented by flux lines 46. This field acts in conjunction with secondary electrons from targets 12,14 to create intense, magnetron discharge, plasma regions as represented by the shaded areas 48. Other names used for this type of field include multipolar, multicusp or multidipole.

Figure 4:
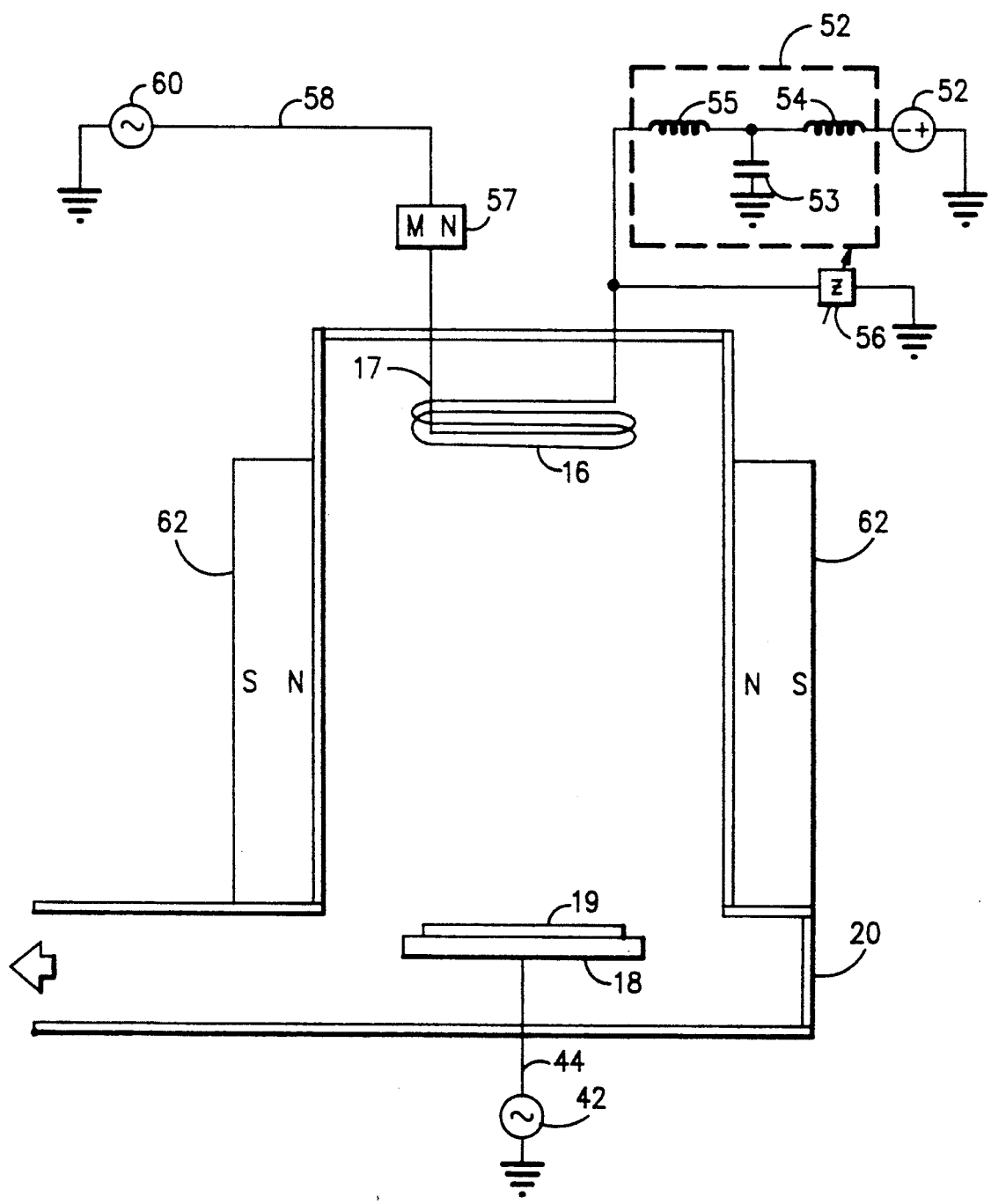
FIG. 4 is a cross sectional, schematic drawing of second embodiment of a sputter system according to the present invention.

Referring now to FIG. 4, a second embodiment of the present invention includes a rf coil 16 which is used as the sole sputter source of a deposition apparatus by providing DC bias to the coil using a DC source 50 coupled through a rf decoupling network 52, comprising a capacitor 53 and inductors 54, 55. Rf coil 16, of course, must either be manufactured from or coated with the desired sputter material. Rf power is supplied to the coil through line 58 using rf power supply 60 and matching network 57. A variable shunt impedance 56 may be used to control the rf voltage on coil 16. In the absence of this shunt, the cold end 17 of coil 16 must be capacitively connected to ground (i.e. by replacing shunt 56 with a large capacitor). A plurality of magnets 62, (only two of which are shown), are placed around the vacuum chamber 20. The resultant magnetic fields 62 create surface magnetic confinement of plasma electrons, thus producing an intense plasma and thereby causing a high ionization ratio of the neutral sputtered atoms. These ions are directionally accelerated toward the biased substrate 19, which is controlled by DC or rf bias supply 42 through line 44.

Figure 5:
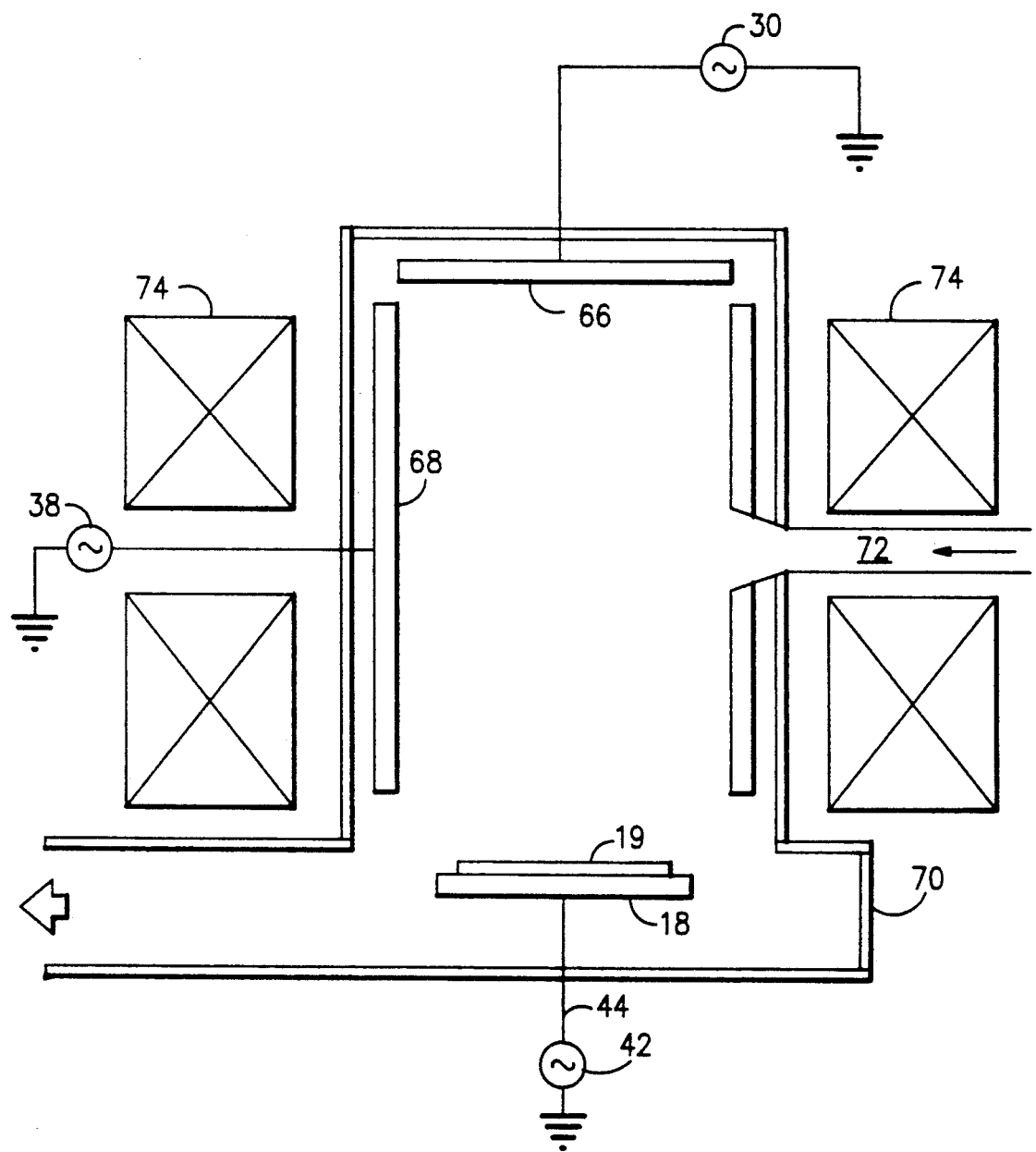
FIG. 5 is a cross sectional, schematic drawing of a third embodiment of a sputter system according to the present invention.

Referring now to FIG. 5, a third embodiment of the present invention includes a circular end sputter target 66 and a cylindrical, hollow, cathode magnetron sputter target 68 contained within vacuum chamber 70. Power sources 30,38 provide electrical energy necessary to cause sputtering of respective targets 66,68 as previously described. Electromagnets 74 create magnetron discharges adjacent to target 68 and thereby produce a high fraction of sputter material ions which are accelerated towards the biased substrate 19. Voltage source 42 biases substrate 19 through line 44. A microwave power source (not shown) provides microwave energy through wave guide 72 and is a substitute power source for the rf coil 16 used in previously described embodiments. The resultant plasma can be maintained by: a) microwave power (as in an "ECR" type plasma); b) ri or DC voltage applied to the targets; c) rf induction; and d) Whistler waves, all of which may be used singularly or in combinations thereof. The uniformity of deposition can be adjusted by changing the voltage or power between the end target 66 and cylindrical magnetron target 68 because the cylindrical target 68 produces the highest deposition rate on the outside part of substrate 19 and the end target 66 produces the highest deposition rate on the inside part of substrate 19.

Electromagnets 74 are used in the third embodiment because it is necessary to have a strong B field (about 0.1 Tesla) over the majority of the chamber volume. The other embodiments of the present invention described herein require only strong localized B fields in close proximity to the sputter targets. Permanent magnets are therefore acceptable as the B field source although electromagnets could very well be used in there place.

Figure 6:
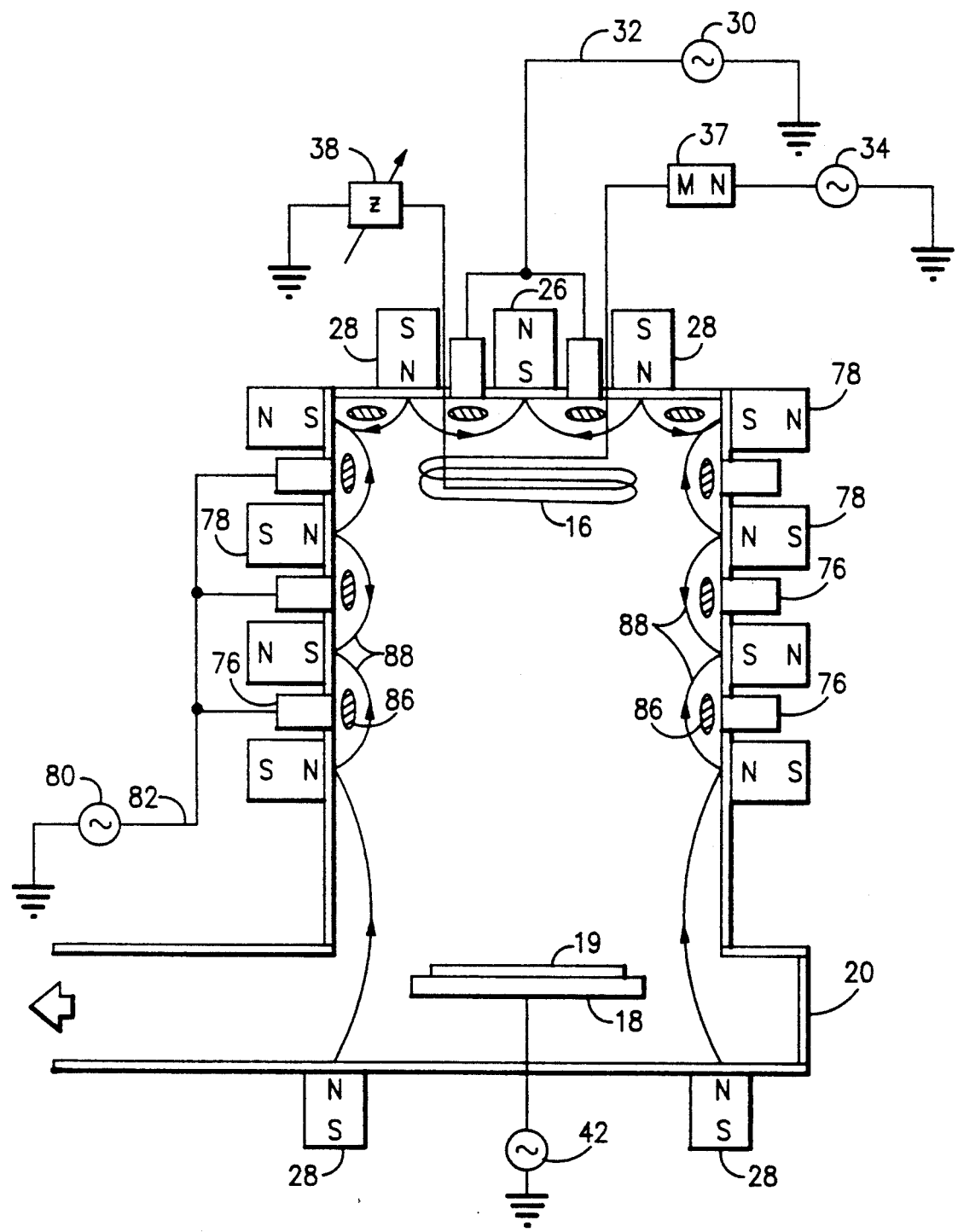
FIG. 6 is a cross sectional, schematic drawing of a fourth embodiment of a sputter system according to the present invention.

Referring now to FIG. 6, a fourth embodiment of the present invention includes a rf coil 16, rf supply 34, matching network 37, variable series impedance 38, chuck 18, substrate 19, and bias supply 42 used in conjunction with a series of ring-type sputter targets 76 and magnets 78. The sputter targets 76, 77 are biased by signal sources 80, 30 through lines 82,32 respectively. Ring magnets 78 are radially magnetized. The combination of ring targets 76 and ring magnets 78 produce a multipole, magnetron discharge effect. Intense magnetron discharges (represented by shaded patterns 86) will occur in the spaces between the multipole magnetic cusps (represented by flux lines 88). Since the rf coil 16 is actually located in the vacuum vessel, auxiliary magnets 26, 28 may be placed on the top and bottom of the chamber 20 to increase the plasma confinement and to create additional regions of magnetron discharge. The sputtered material will be deposited on substrate 19, which is biased by supply 42. The bias on the substrate will determine the directionality of the deposition because it affects the trajectories of the ionized sputtered atoms.

The ions produced in vacuum chamber 20 of all of the aforementioned embodiments of the present invention, as illustrated in FIGS. 1-6, which strike the substrate 19 will have low angular divergence after crossing the plasma sheath and therefore will fill high AR holes uniformly.

Furthermore, the temperature of the chuck 18 and substrate 19 can be controlled by any of the standard methods well known in the prior art, including electrostatic clamping with backside helium gas conduction.

Also, it is to be noted that the aforementioned embodiments of the present invention provide for high plasma densities (greater than $10^{11}$ cm$^{-3}$) to be distributed throughout a major portion of the vacuum chamber.

Furthermore, low pressures (e.g. 0.02 to 10 mTorr) of CVD gas may also be used to increase system pressure and deposition rates. In this "CVD/sputter" mode, the volatiles (e.g. hydrogen) may be pumped away while the desired components are maintained in the plasma (by sputtering from the targets 66,68) until they are deposited on the substrate 19. The particular amount of resputtering and the energy per ion necessary to obtain desired film properties may be changed by varying the rf bias to the substrate 19. Also, the high plasma density generated makes it possible to turn off the flow of sputtering gas (e.g. Argon) and sustain the plasma by impact of ionized sputtered atoms onto the sputter target self-sputtering). In the case of metal sputter targets, this facilitates the generation of pure metal plasmas, which enables high deposition rates and allows the present invention to be used as a single substrate tool. The use of pure metal plasma also favorably affects the physical properties (i.e. absence of impurities) of the sputter grown films.

Figure 7:
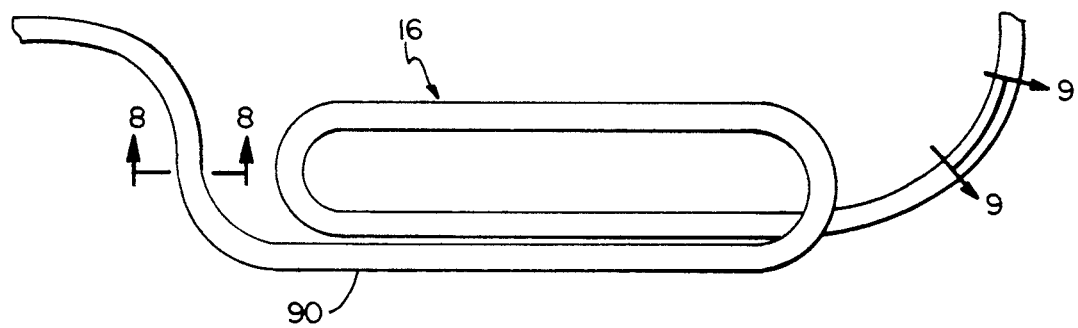
FIG. 7 is a side view of rf coil according to the present invention.

Referring now to FIG. 7, rf coil 16 includes a hollow tube 90 having permanent magnets (92 or 94) disposed inside. Placing magnets (92 or 94) inside the tube accomplishes three things: 1) it reduces the plasma loss area (due to recombination of the sputtered atoms with the coil) to the magnetic pole area; 2) it produces crossed dc and rf magnetic fields which can drive the plasma through Whistler mode plasma waves; and 3) it reduces the capacitive coupling losses of the coil.

Figure 8:
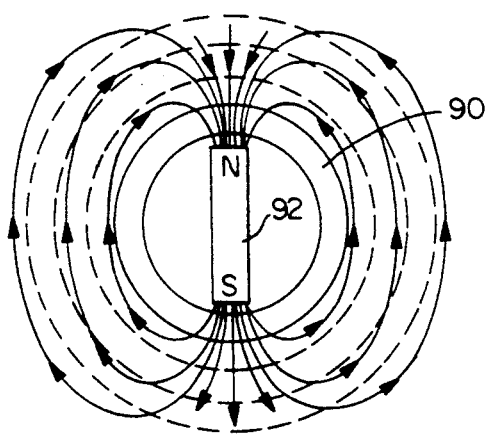
FIG. 8 is a cross sectional view, taken along line 8—8 of FIG. 7, of a first embodiment of a rf coil according to the present invention.

Referring now to FIG. 8, permanent magnets 92 may be disposed inside tube 90 with their magnetization directed radially outward from the center of the tube to thereby produce line cusps (not shown) along the length of the tube.

Figure 9:
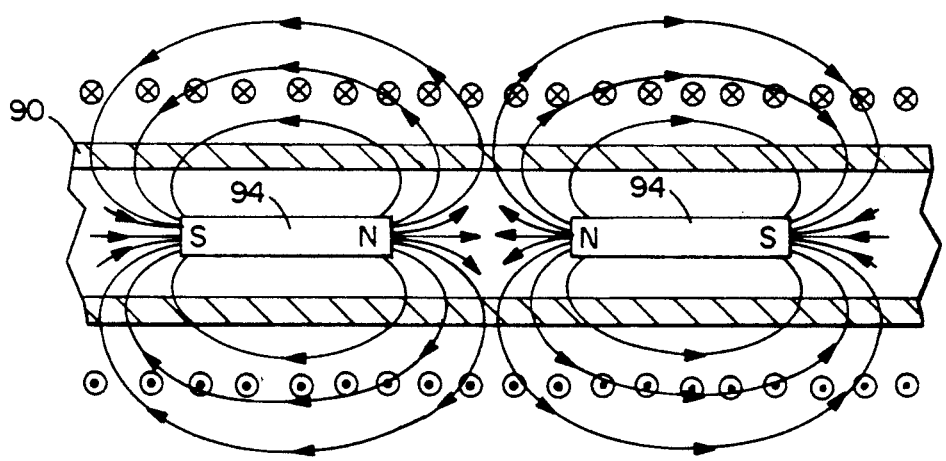
FIG. 9 is a cross sectional view, taken along line 9—9 of FIG. 7, of a second embodiment of a rf coil according to the present invention.

Referring now to FIG. 9, permanent magnets 94 may also be disposed inside tube 90 with their magnetization directed axially along the tube to thereby produce ring cusps (not shown) at each pole face.

Use of magnets inside rf coil 16 allows the plasma to run at lower pressure, higher efficiency, and higher plasma density. This coil design may also be applied to other inductive coil sputter systems not described herein, including internal or external coil systems.

Although the invention has been shown and described with exemplary embodiments thereof, it should be understood by those skilled in the art that the foregoing and various other changes, omissions and additions may be made therein and thereto without departing from the spirit and scope of the invention.

We claim:

1. An apparatus for depositing a material onto a substrate in a vacuum chamber comprising:
   sputtering means for providing a sputtering source of the material;
   magnetic means for providing a multidipole magnetic field for magnetic confinement of plasma electrons;
   rf energy transmission means disposed in the vacuum chamber for inductively coupling rf electrical energy into the vacuum chamber directly for producing a plasma of sufficient density and volume in the vacuum chamber to cause ionization of sputtered atoms; and
   substrate placement means for placing the substrate in contract with said plasma.

2. The apparatus for depositing a material onto a substrate in a vacuum chamber as defined in claim 1, further comprising biasing means for electrically biasing the substrate with DC or rf energy for controlling the energy and direction of ions impinging on the substrate.

3. The apparatus for depositing a material onto a substrate in a vacuum chamber as defined in claim 1, wherein said sputtering means comprises:
   a first sputter target;
   a second sputter target disposed between said first sputter target and the substrate; and
   first and second sputter power source means for providing electrical energy to said first and second sputter targets respectively to cause sputtering thereof.

4. The apparatus for depositing a material onto a substrate in a vacuum chamber as defined in claim 3, further comprising means for varying the power between said first sputter target and said second sputter target in order to adjust the uniformity of deposition over the surface of the substrate.

5. An apparatus for depositing a material onto a substrate in a vacuum chamber as defined in claim 1, wherein said sputter means comprises:
   a first sputter target;
   a second cylindrical, hollow sputter target disposed between said first sputter target and the substrate; and
   first and second sputter power source means for providing electrical energy to said first and second sputter targets, respectively, to cause sputtering thereof.

6. The apparatus for depositing a material onto a substrate in a vacuum chamber as defined in claim 5, further comprising means for varying the power between said first sputter target and said second sputter target in order to adjust the uniformity of deposition over the surface of the substrate.

7. The apparatus for depositing a material onto a substrate in a vacuum chamber as defined in claim 1, further comprising:
   gas means for providing gas in the vacuum chamber, said gas having an atomic mass greater than the atomic mass of the material.

8. The apparatus for depositing a material onto a substrate in a vacuum chamber as defined in claim 1, wherein said rf energy transmission means comprises:
   rf power supply means for providing said rf electrical energy; and
   rf coil means for transmitting said rf electrical energy into said plasma.

9. The apparatus for depositing a material onto a substrate in a vacuum chamber as defined in claim 1, wherein said rf energy transmission means comprises:
   rf power supply means for providing said rf electrical energy;
   rf coil means for inductively coupling said rf electrical energy into said plasma; and,
   magnetization means for magnetizing said rf coil means, wherein said magnetization means confines plasma away from at least part of said rf coil means.

10. The apparatus for depositing a material onto a substrate in a vacuum chamber as defined in claim 1, wherein said rf energy transmission comprises:
    rf power supply means for providing said rf electrical energy;
    a hollow rf coil means for inductively coupling said rf electrical energy into said plasma; and
    at least one magnet disposed within said hollow rf coil means for confining plasma away from at least part of said hollow rf coil means.

11. The apparatus for depositing a material onto a substrate in a vacuum chamber as defined in claim 1, wherein said rf energy transmission means and said sputtering means comprises:
    rf coil means;
    sputter power source means for providing electrical energy to said rf coil means to cause sputtering thereof;
    rf power source means for providing said rf electrical energy to said rf coil means to cause said rf coil means to inductively couple said rf electrical energy into the vacuum chamber; and
    decoupling means for decoupling said sputter power source means from said rf power source means.

12. The apparatus for depositing a material onto a substrate in a vacuum chamber as defined in claim 1, wherein:
   said magnet means comprises a plurality of ring shaped magnets; and
   said sputter means comprises a plurality of ring shaped targets disposed between said ring shaped magnets and a sputter power supply for providing power to said sputter targets to cause sputtering thereof.

13. An apparatus for depositing a material onto a substrate in a vacuum chamber comprising:
   a first sputter target;
   first sputter power source means for providing electrical energy to said first sputter target for causing sputtering thereof;
   first magnet means for providing a multidipole magnetic field for magnetic confinement of plasma electrons in close proximity to the sputtering surface of said first sputter target;
   a hollow, cylindrical, second sputter target disposed between said first sputter target and the substrate;
   second sputter power source means for providing electrical energy to said second sputter target for causing sputtering thereof;
   second magnet means for providing a multidipole magnetic field for magnetic confinement of plasma electrons in close proximity to the sputtering surface of said second sputter target;
   rf coil means disposed in the vacuum chamber for inductively coupling rf energy into the vacuum chamber directly for producing a plasma of sufficient density and volume to cause ionization of sputtered atoms therein;
   rf power source means for providing rf energy to said rf coil means;
   bias means for providing electrical bias to the substrate for controlling the direction and energy of ions impinging thereon; and
   substrate placement means for placing the substrate in contact with said plasma.

14. The apparatus for depositing a material onto a substrate in a vacuum chamber as defined in claim 13, wherein said rf coil means comprises:
   a coiled hollow tube; and
   a plurality of magnets disposed within said hollow tube for confining plasma away from said rf coil means.

15. An apparatus for depositing a material onto a substrate in a vacuum chamber comprising:
   an rf coil disposed in the vacuum chamber and composed at least partly of the material;
   sputter power source means for providing electrical energy to said rf coil to cause sputtering of the material therefrom;
   magnet means for providing a multidipole magnetic field for confinement of plasma electrons in close proximity to said rf coil;
   rf power source for providing rf power to said rf coil to cause said rf coil to inductively couple rf energy into the vacuum chamber for producing a plasma of sufficient density and volume to cause ionization of sputtered atoms;
   decoupling means to decouple said sputter power source means from said rf power source means;
   bias means for providing electrical bias to the substrate for controlling the direction and energy of ions impinging thereon; and
   substrate placement means for placing the substrate in contact with said plasma.

16. An apparatus for depositing a material onto a substrate in a vacuum chamber comprising:
   a first sputter target;
   first sputter power source means for providing electrical energy to said first sputter target for causing sputtering thereof;
   first magnet means for providing a multidipole magnetic field for confining plasma electrons in close proximity to the sputtering surface of said first sputter target;
   a plurality of ring sputter targets disposed between said first sputter target and the substrate;
   second sputter power source means for providing electrical energy to said ring sputter targets for causing sputtering thereof;
   a plurality of ring magnet means disposed adjacent to said ring sputter targets for providing a multidipole magnetic field for confining plasma electrons in close proximity to the sputtering surface of said ring sputter targets;
   rf coil means disposed in the vacuum chamber for inductively coupling rf energy into the vacuum chamber directly for producing a plasma of sufficient density and volume to cause ionization of sputtered atoms;
   rf power source means for providing rf energy to said rf coil means;
   bias means for providing electrical bias to the substrate for controlling the direction and energy of ions impinging thereon; and
   substrate placement means for placing the substrate in contact with said plasma.

17. An apparatus for producing a plasma in a vacuum chamber comprising:
   rf power source means for providing rf energy;
   hollow rf coil means for inductively coupling said rf energy into the vacuum chamber; and
   a plurality of magnets disposed within said rf coil means for confining plasma away from said rf coil means.

18. The apparatus for producing a plasma in a vacuum chamber as defined in claim 17, wherein said magnets are positioned with their magnetization directed radially outward from the center of said tube.

19. The apparatus for a vacuum chamber as defined in claim 17, wherein said magnets are positioned with their magnetization directed axially along the length of said tube.

20. A method of depositing a material upon a substrate in a vacuum chamber comprising the steps of:
   sputtering the material off of at least one target with magnetron discharge;
   inductively coupling rf electrical energy directly into the vacuum chamber using a rf coil disposed in the vacuum chamber in order to cause ionization of said sputtered material;
   confining the plasma whereby produced using a multidipole magnetic field; and,
   placing the substrate in contact with said plasma.

21. The method of depositing a material upon a substrate in a vacuum chamber as defined in claim 20, further comprising the step of:
   biasing the substrate to control the energy and directionality of ions impinging on the substrate.

22. A method of depositing a material upon a substrate in a vacuum chamber comprising the steps of:

sputtering the material off of at least one target with magnetron discharge;

inductively coupling rf power directly into the vacuum chamber using a rf coil disposed in the vacuum chamber in order to cause ionization of said sputtered material;

confining the plasma thereby produced using a multidipole magnetic field;

placing the substrate in contact with said plasma; and, biasing the substrate to control the energy and directionality of ions impinging on the substrate.

23. The method of depositing a material upon a substrate in a vacuum chamber as defined in claim 20 or 22 further comprising the step of adding CVD gas into the vacuum chamber.

24. The method of depositing a material upon a substrate in a vacuum chamber as defined in claim 20 or 22, further comprising the step of placing magnets inside said rf coil to confine plasma away from at least part of said rf coil.

* * * * *